(12) United States Patent
Anzaki et al.

(10) Patent No.: US 6,277,507 B1
(45) Date of Patent: Aug. 21, 2001

(54) METHOD FOR COATING INSULATING FILM AND GLASS SUBSTRATE FOR IMAGE DISPLAY USING THE SAME

(75) Inventors: Toshiaki Anzaki; Etsuo Ogino, both of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/336,784

(22) Filed: Jun. 21, 1999

(30) Foreign Application Priority Data

Jul. 6, 1998 (JP) .................................... 10-190436

(51) Int. Cl.[7] ............... B32B 9/00; B32B 19/00
(52) U.S. Cl. .................. 428/702; 428/215; 428/216; 428/426; 428/428; 428/546; 428/698; 428/702
(58) Field of Search .................... 428/215, 216, 428/426, 428, 546, 698, 702

(56) References Cited

U.S. PATENT DOCUMENTS 4,187,336 * 2/1980 Gordon .................................. 428/34

* cited by examiner

Primary Examiner—Deborah Jones
Assistant Examiner—Lymarie Miranda
(74) Attorney, Agent, or Firm—Sughrue, Mion, Macpeak & Seas, PLLC

(57) ABSTRACT

A process for inexpensively producing an insulating substrate suitable for use in image displays fabricated through a high-temperature production step, such as plasma displays and field emission displays (FED). A multilayered insulating film of one member selected from $SiO_2$, a silicon oxynitride, and a silicon nitride is coated on a surface of a glass plate by reactive sputtering using one or more silicon targets in oxygen or/and nitrogen. The interface between layers in the multilayered insulating film functions to trap sodium ions thermally diffusing from the glass, whereby the amount of sodium ions which dissolve in the insulating film and reach the surface thereof is considerably reduced.

6 Claims, 2 Drawing Sheets

METHOD FOR COATING INSULATING FILM AND GLASS SUBSTRATE FOR IMAGE DISPLAY USING THE SAME

FIELD OF THE INVENTION

The present invention relates to a method for coating an insulating film having the ability to prevent alkali dissolution, on a surface of a glass plate, in particular, a glass plate containing an alkali component such as sodium. The present invention further relates to a glass substrate suitable for use in image displays fabricated through a high-temperature production step, such as liquid-crystal displays, not to mention plasma displays and field emission displays (FED).

BACKGROUND OF THE INVENTION

In producing a liquid-crystal display, a glass is coated with an insulating film of $SiO_2$ in a thickness of about from 0.04 to 0.15 μm in order to prevent the alkali components such as sodium and potassium contained in the glass from dissolving in the liquid-crystal cell. Techniques used for forming this $SiO_2$ film include: a high-frequency sputtering process in which a quartz glass is used as a target; a method comprising applying a solution of an organosilicon compound to a surface of a glass plate and heating the coating to form an $SiO_2$ film; the CVD process (chemical vapor deposition process) disclosed in JP-A-61-63545 (the term "JP-A" as used herein means an "unexamined published Japanese patent application") in which a vapor of an organosilicon compound is blown against a heated glass plate; and the technique disclosed in JP-A-60-176947 in which hydrosilicofluoric acid is used. The $SiO_2$ film coated by either of these methods has electrical insulating properties and also the ability to prevent alkali dissolution, and the glass plates thus coated are in practical use in liquid-crystal displays.

In the process steps for fabricating an STN liquid-crystal display, the maximum temperature used therein is about 350° C. In contrast, in fabricating image displays having an inner space which has a reduced pressure or is vacuum, such as plasma displays and field emission displays, the process steps involve a high-temperature step where a temperature of 500° C. or higher is used, because two spaced glass substrates are united into a panel by sealing the edge parts thereof with a glass frit through sintering.

However, the $SiO_2$ insulating films coated by the prior art techniques described above are known to have the following drawback. When a glass plate coated with the $SiO_2$ insulating film is processed at a temperature of 500° C. or higher, for example, in the step of sealing with a glass frit, alkali components contained in the glass, especially sodium ions, diffuse into the insulating film.

In particular, when the heat treatment is conducted at a high temperature for a prolonged time period, the alkali components dissolve in the insulating film and diffuse to the surface of the film. There has hence been a fear that the alkali components present on the surface of the insulating film may exert an adverse influence on the operation of an element to be formed on the glass substrate surface facing the inside of the panel.

An attempt was made to overcome the above problem by increasing the thickness of the $SiO_2$ film. However, this measure has problems that the coated $SiO_2$ film cracks probably because of the internal stress within the film, resulting in no improvement in insulating properties, and that formation of the thick film requires much time, resulting in reduced productivity in the coating step of the insulating film.

Namely, the $SiO_2$ film coated as an alkali dissolution preventive film on a glass plate by any of the prior art techniques has a problem that alkali components contained in the glass thermally diffuse to the surface of the $SiO_2$ film upon high-temperature heat treatment and the film does not always show sufficient insulating properties.

SUMMARY OF THE INVENTION

Accordingly, one object of the present invention is to provide a method for coating an insulating film.

Another object of the present invention is to provide a glass substrate for image display using the insulating film.

The present invention provides a method for coating an insulating film, which comprises coating an insulating film of one member selected from $SiO_2$, a silicon oxynitride, and a silicon nitride on a surface of a substrate by reactive sputtering using one or more silicon targets in oxygen or/and nitrogen in a vacuum apparatus in which an atmosphere having a reduced pressure can be adjusted, such that a multilayered insulating film is formed.

In the preferred embodiment of the above method, the sputtering is reactive sputtering in which two silicon targets respectively disposed on two closely arranged cathodes are used, and a plasma discharge for which one of the cathodes is used as a negative electrode and the other is used as a positive electrode is generated alternately with a plasma discharge for which the one cathode is used as a positive electrode and the other is used as a negative electrode.

The present invention further provides a glass substrate for image display, which comprises a glass plate containing an alkali component and the insulating film coated on a surface of the glass plate by the above-described method, wherein the interface between layers in the insulating film functions to trap the alkali component thermally diffusing from the glass plate.

In one preferred embodiment of the glass substrate for image display, the insulating film has a thickness of 0.5 μm or larger. By regulating the total thickness of the insulating film to 0.5 μm or larger, an alkali contained in the glass can be effectively inhibited from dissolving in the insulating film and diffusing to both the surface of the film and a nearby part thereof.

Furthermore, by increasing the number of layers, the amount of the alkali component thermally diffusing to the surface of the insulating film and its nearby part can be reduced further.

In another embodiment of the glass substrate for image display, the insulating film has a thickness of 2 μm or smaller. This is because even when the total thickness of the insulating film is increased beyond 2 μm, the amount of a dissolved alkali present on the surface of the insulating film and its nearby part cannot be effectively reduced any more.

DESCRIPTION OF THE SYMBOLS

Figure 1:
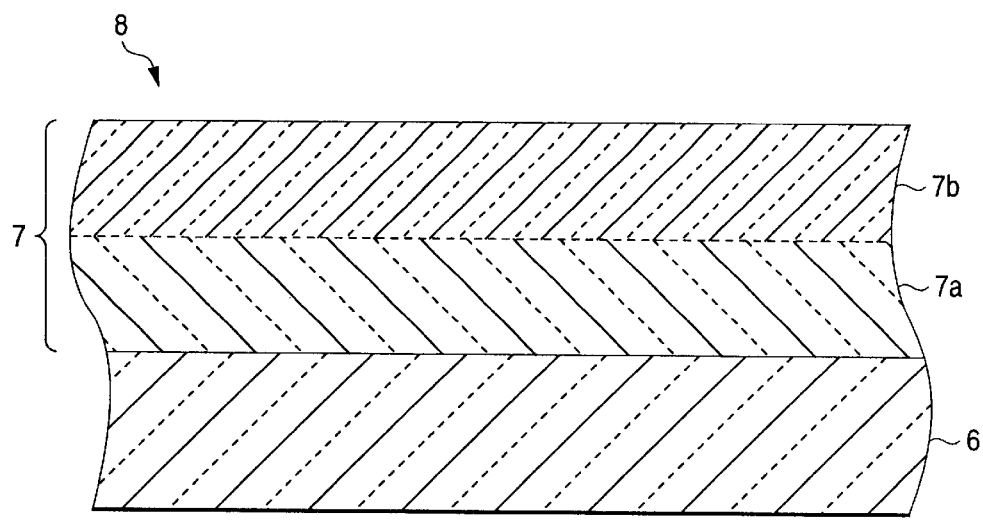
FIG. 1 is a sectional view of a part of one embodiment of the glass substrate for image display of the present invention.

1: vacuum chamber 2A, 2B: magnetron cathode 3A, 3B: silicon target
4: gas feed pipe
5: polarity inversion power supply
6: glass plate
7: insulating film
7a, 7b: layer
8: glass substrate for image display

DETAILED DESCRIPTION OF THE INVENTION

The present invention will be explained below by reference to the accompanying drawings. FIG. 1 is a sectional view of a part of one embodiment of the glass substrate for image display 8 according to the present invention. This glass substrate 8 comprises a glass plate 6 and an insulating film 7 coated on a surface thereof. The insulating film 7 is an $SiO_2$ film, a silicon oxynitride film, or a silicon nitride film. In the present invention, the insulating film may contain an electrically insulating metal oxide such as, alumina, zirconia or titania, so long as the insulating properties of the film are not considerably reduced by the optional ingredient.

The insulating film 7 is coated so as to form a multilayer structure comprising a first layer 7a and a second layer 7b. Formation of a multilayered film can be accomplished by bonding a silicon target to a magnetron cathode of, for example, a planar shape and conducting sputtering while passing a glass plate at least twice through a space in front of the silicon target to be sputtered. In general, the, glass plate is passed at a constant speed through the space in front of the target. Alternatively, a multilayered film can be obtained by a method in which sputtering is conducted on a glass plate which is held stationary in front of the target and, in the course of the sputtering, a shielding plate is interposed between the target and the glass plate to interrupt the coating.

Figure 2:
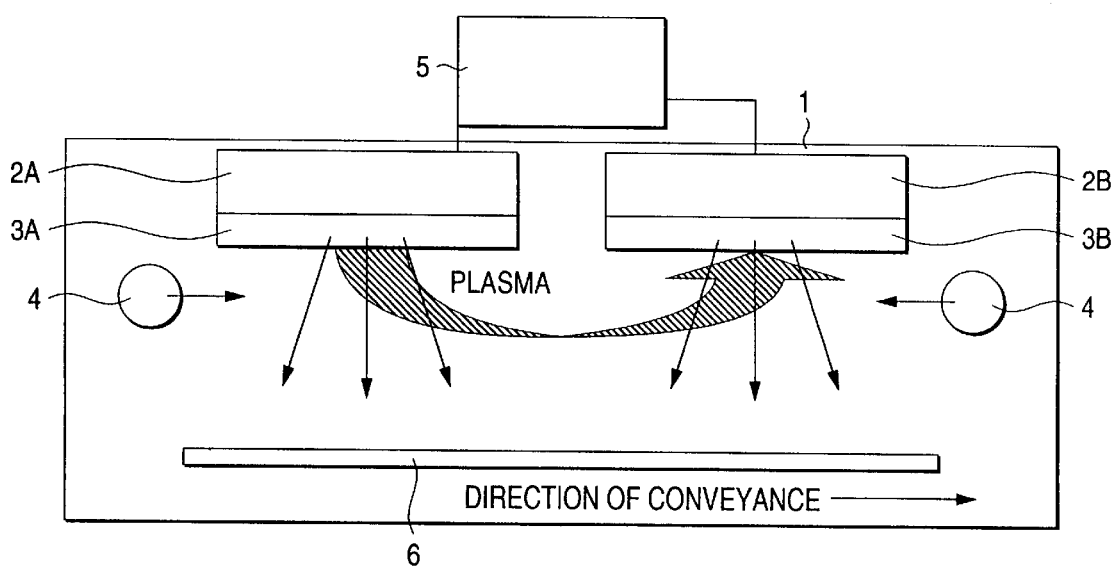
FIG. 2 is a diagrammatic sectional view of an apparatus which view illustrates the sputtering method used in the Examples according to the present invention.

FIG. 2 is a diagrammatic sectional view of an apparatus used in carrying out the present invention. This apparatus has a vacuum chamber 1 capable of being evacuated with a vacuum pump (not shown). Within the vacuum chamber 1 has been disposed a rectangular magnetron cathode 2A, which has a silicon target 3A bonded to a surface thereof. Near the magnetron cathode 2A has been disposed a magnetron cathode 2B of the same structure, which also has a silicon target 3B bonded to a surface thereof. Oxygen is introduced through gas feed pipes 4 and 4 in the directions indicated by arrows. In a given atmosphere having a reduced pressure, silicon atoms are ejected in the downward directions indicated by arrows in FIG. 2 and an $SiO_2$ film is coated on a surface of a glass plate 6 when the glass plate 6 is being passed through the space in front of the silicon targets 3A and 3B with a conveyor (not shown).

For applying a negative voltage to the cathode 2A and the cathode 2B to eject silicon atoms therefrom a polarity inversion power supply 5 is used, in which polarity inversion occurs at a frequency of several tens of kilohertz. A plasma discharge for which the cathodes 2A and 2B are used as a negative electrode and a positive electrode, respectively, and a plasma discharge for which the cathodes 2B and 2A are used as a negative electrode and a positive electrode, respectively, are alternately generated to conduct reactive sputtering This sputtering is advantageous in that even if an electrically insulating silicon oxide is formed on the surface of either silicon target, the charge-up which can be caused by the silicon oxide is inhibited by the charge-neutralizing effect of the inverted potential, whereby microsparking is prevented. As a result, an electrically insulating $SiO_2$ film can be coated on the glass plate at a high rate without causing the abnormal discharge called arcing.

Where the apparatus shown in FIG. 2 is used for coating a multilayered film with the two cathodes to which power is supplied from the polarity inversion power supply 5, one layer is formed by a combination of coating with the silicon target 3A and subsequent coating with the silicon target 3B. Namely, a multilayered film is coated by passing the glass plate two or more times in front of these two targets as a set. When a set of two targets is arranged in the manner shown in FIG. 2, a two-layer film is coated by conveying the glass plate in front of the set of targets from left to right and then from right to left. It is also possible to use an apparatus having two or more sets of cathodes arranged in the vacuum chamber along the direction of glass plate conveyance. With this apparatus, a multilayered film can be coated by conveying a glass plate 6 in one direction only.

Formation of a multilayered film is accomplished by passing a substrate in front of one or more targets and conducting the operation for subsequent coating after the substance to be sputtered has come not to reach the substrate.

In the present invention, an insulating film of $SiO_2$ can be coated by reactive sputtering using one or more silicon targets in a mixed gas comprising an inert gas, e.g., argon, and oxygen or in oxygen gas. An insulating film of a silicon oxynitride can be coated by reactive sputtering using one or more silicon targets in a mixed gas comprising an inert gas, e.g., argon, oxygen, and nitrogen, or in a mixed gas comprising oxygen and nitrogen. An insulating film of a silicon nitride can be coated by reactive sputtering using one or more silicon targets in a mixed gas comprising an inert gas, e.g., argon, and nitrogen, or in nitrogen gas.

The above-described method in which one polarity inversion power supply is used to alternately bombard targets disposed respectively on two cathodes with positive ions is a preferred mode of the sputtering according to the present invention because this method attains a high coating rate. It is however possible to use high-frequency sputtering or DC sputtering in which one high-frequency or DC power supply is used to conduct sputtering with one or more targets each bonded to a cathode. A preferred silicon target is one to which electrical conductivity has been imparted by doping with a small amount of boron, etc., because this target contributes to stable sputtering.

The present invention will be explained below by reference to the following Examples and Comparative Examples, but the invention is not limited thereto.

(Explanation on Tables 1 and 2)

(1) In each insulating film, the constituent layers were regulated so as to have almost the same thickness. For regulating the total thickness of each film and the thickness of each constituent layer thereof, the speed of glass plate conveyance was controlled while maintaining a constant voltage applied to silicon targets.

(2) The expression $SiO_{96}N_4$ indicating the composition of a silicon oxynitride means that the proportions of oxygen and nitrogen in the compound are 96 atomic % and 4 atomic %, respectively, based on the sum of oxygen and nitrogen.

Figure 3:
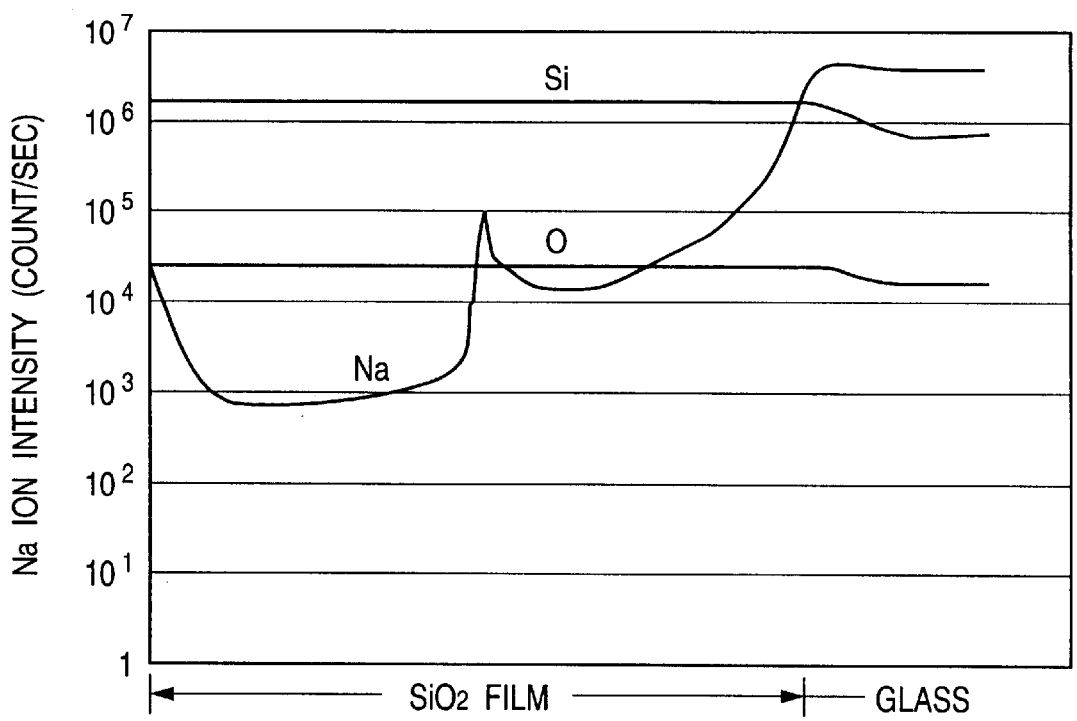
FIGS. 3(*a*)–3(*b*) are graphic presentations showing the distribution of thermally diffused sodium ions in the $SiO_2$ insulating film obtained in Example 2 (FIG. 3(*a*)) and that obtained in Comparative Example 2 (FIG. 3(*b*)).
Figure 3:
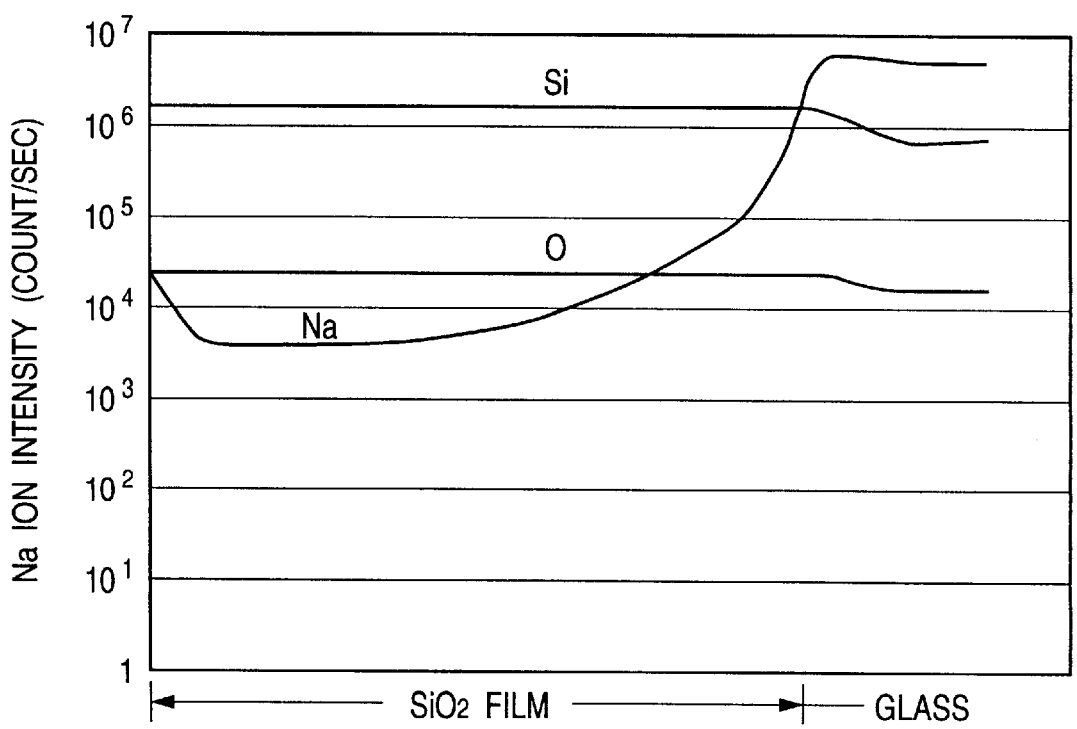

(Explanation on FIG. 3)

(1) In each of the insulating films shown in FIG. 3, the amount of sodium ions (count/sec) present on the surface thereof is larger than in a part thereof located nearby the surface (i.e., in the inner part which is slightly apart from the surface and has the minimum value of sodium ion count). This is attributable mainly to contamination with sodium ions which have come from the surrounding atmosphere, with sodium ions which have come as a result of sample handling, and with sodium ions which have come from cut edges of the substrate.

In each of Tables 1, 2, and 3, each value of sodium ion count is the value for the inner part which is slightly apart from the surface, has not undergone surface contamination, and has the smallest sodium ion count, as shown in FIG. 3.

EXAMPLE 1

Using the apparatus shown in FIG. 2, an $SiO_2$ film was coated on a sufficiently cleaned soda-lime silicate glass plate by sputtering using silicon targets containing about 0.02 wt % boron in oxygen as a reactant gas. The glass contained about 13 wt % $Na_2O$ and about 0.3 wt % $K_2O$ as alkali components. In the sputtering, the glass plate was passed in front of the set of silicon targets as shown in FIG. 2 from left to right and then from right to left to thereby coat a two-layer film. The sputtering was conducted at a constant voltage of 295 V and a constant power of 5 W per $cm^2$ of the targets. Conditions concerning the atmospheric gas, coating rate, and the number of layers are shown in the column of Example 1 in Table 1. During the coating, the glass plate was not particularly heated.

The sample obtained was heated at 500° C. in the air for 2 hours to permit sodium ions to diffuse into the insulating film. This sample was analyzed by SIMS (secondary-ion mass spectroscopy) to determine the distribution of the diffused sodium ions in terms of depth-direction concentration profile. Conditions for this analysis are as follows, and the results obtained are shown in Table 1 in terms of sodium ion intensity (count/sec).
(SIMS)
Primary-ion source: $O_x$ (3 KV, 200 nA)
Analysis region: 300 μm square
Secondary ion detected: $Na^+$ ion
Charge correction with electron gun: conducted As shown in the column of Example 1 in Table 1, a near-surface part of the insulating film of this sample had a sodium intensity of 7,500 counts/sec, which was about 0.21% of the sodium ion intensity of the glass shown in Table 3, which will be given later. It was thus found that even after the heat treatment, the sodium ion amount in the near-surface part of the insulating film was as small as about 2/1,000 the amount of sodium ions in the glass.

This sodium ion amount for the sample was 62.5% of the sodium ion amount for the sample of Comparative Example 1 which will be described later, which had a single-layer insulating film having the same total thickness. It was thus found that the coating of a two-layer film was effective in reducing the amount of dissolved sodium ions present in a near-surface part of the insulating film. Namely, it was found that the ability of an insulating film to prevent alkali dissolution is improved by coating the film so as to have a two-layer structure.

EXAMPLE 2

An insulating film was coated in the same manner as in Example 1, except that the total thickness of the insulating film was changed to 0.5 μm. The sample was heated at 500° C. for 2 hours and then analyzed to determine the amount of sodium ions present in a near-surface part of the insulating film. The results obtained are shown in Table 1. The sodium ion amount in the near-surface part of the insulating film was 900 counts/sec, which was 0.026% of the sodium ion amount in the glass. That value of sodium ion amount was 20% of the sodium ion amount in the single-layer insulating film obtained in Comparative Example 2 which will be given later. It was thus found that the two-layer insulating film had a far smaller sodium ion amount in a near-surface part than the single-layer insulating film. In view of the sodium ion content of about 13% in the glass used, this value of sodium ion amount corresponded to 0.0034 wt % of the sodium ions contained in the glass. Namely, that amount of sodium ions in the insulating film is thought to be equal to or smaller than the amount of sodium ions present on the surface of a no-alkali glass.

The sample which had undergone the heat treatment was analyzed by SIMS to determine the distribution of diffused sodium ions in a direction along a section of the insulating film. The results obtained are shown in FIG. 3 together with the results for the sample obtained in Comparative Example 2 (having a single-layer insulating film) which had undergone heating at 500° C. for 2 hours. As shown in FIG. 3(a), the sodium ion distribution curve for the two-layer insulating film coated in Example 2 had a peak of sodium ion intensity at the position corresponding to the interface between the layers. It can be seen from the results that a considerable proportion of the sodium ions which had thermally diffused from the glass into the insulating film were trapped by the layer interface. Namely, this layer interface was found to function to inhibit sodium ions from diffusing into the second layer, i.e., the outer layer, of the insulating film.

On the other hand, FIG. 3(b) shows that in the single-layer insulating film deposited in Comparative Example 2, a larger amount of sodium ions had diffused into near-surface parts of the insulating film because the film had no such trapping plane.

EXAMPLES 3 TO 7

Samples each having an $SiO_2$ insulating film deposited thereon were prepared in the same manner as in Example 1, except that the total film thickness, the number of layers and the gas composition in the atmosphere were changed as shown in Table 1. These samples were heated at 500° C. for 2 hours and then examined for the amount of sodium ions present around the insulating film surface. The results obtained are shown in Table 1.

Comparisons between Examples 2 and 3 and between Examples 4 and 5 show that an insulating film comprising a larger number of layers has a smaller amount of dissolved sodium ions thermally diffused to the film surface than an insulating film comprising a smaller number of layers and having the same thickness. This is thought to be attributable to the increase in the number of layer interfaces and the resulting increase in the amount of sodium ions trapped by these interfaces.

A comparison among Examples 1, 2, and 4 shows that an increase in total thickness results in a decrease in the amount of sodium ions present around the insulating film surface. In particular, the increase in total film thickness from 0.2 μm to 0.5 μm resulted in an abrupt decrease in the amount of the dissolved alkali diffused to the insulating film surface.

A comparison between Example 4 and Comparative Example 3 which will be given later shows that also in the case of a total insulating film thickness of 1.0 μm, the amount of sodium ions present on the surface of the multi-layered insulating film was as small as 13.6% of that of sodium ions present on the surface of the single layer film.

EXAMPLES 8 TO 11

Using the apparatus shown in FIG. 2, an insulating film of a silicon oxynitride was coated on a soda-lime silicate glass plate by sputtering using two silicon targets in an oxygen/nitrogen mixed gas as a reactant gas. This film was heated at 500° C. for 2 hours. Each of the samples thus obtained was examined for the amount of sodium ions present in a near-surface part of the insulating film in the same manner as in Example 1. The results obtained are shown in Table 1. In each sample, the sodium ion amount was from 250 to 300 counts/sec, which was not larger than 0.009% of the amount of sodium ions contained in the glass.

COMPARATIVE EXAMPLE 2

An insulating film was coated on a glass plate to obtain a sample in the same manner as in Example 2, except that the film was deposited so as to have a single-layer structure. This sample was heated at 500° C. for 2 hours. The amount of sodium ions present on the surface of the heat-treated film was 4,500 counts/sec as shown in Table 2. Furthermore, this sample was analyzed by SIMS to determine the distribution of sodium ions thermally diffused into the insulating film. The results obtained are shown in FIG. 3(b). It can be seen from the results that the sodium ions which had diffused from the glass into the insulating film were not trapped within the insulating film and a larger amount of sodium ions diffused into near-surface parts of the film than in the sample of Example 2.

TABLE 1

| Example | Film composition | Total thickness ($\mu$m) | Number of layers | Coating rate for each layer (nm · m/min) | Atmosphere of reduced pressure Total pressure (Pa) | Atmosphere of reduced pressure Gas composition (vol %) | Sodium ion intensity in near-surface part of insulating film (count/sec) |
|---|---|---|---|---|---|---|---|
| 1 | $SiO_2$ | 0.2 | 2 | 50 | 0.2 | $O_2$100 | 7500 |
| 2 | $SiO_2$ | 0.5 | 2 | 50 | 0.2 | $O_2$100 | 900 |
| 3 | $SiO_2$ | 0.5 | 10 | 50 | 0.2 | $O_2$100 | 600 |
| 4 | $SiO_2$ | 1.0 | 2 | 50 | 0.2 | $O_2$100 | 300 |
| 5 | $SiO_2$ | 1.0 | 20 | 50 | 0.2 | $O_2$30Ar70 | 100 |
| 6 | $SiO_2$ | 1.5 | 30 | 50 | 0.2 | $O_2$30Ar70 | 100 |
| 7 | $SiO_2$ | 2.0 | 40 | 50 | 0.2 | $O_2$30Ar70 | 70 |
| 8 | $SiO_{99}N_1$ | 1.0 | 2 | 49 | 0.2 | $O_2$98$N_2$2 | 250 |
| 9 | $SiO_{96}N_4$ | 1.0 | 2 | 46 | 0.2 | $O_2$95$N_2$5 | 250 |
| 10 | $SiO_{60}N_{40}$ | 1.0 | 2 | 42 | 0.2 | $O_2$58$N_2$42 | 300 |
| 11 | $SiO_{20}N_{80}$ | 1.0 | 2 | 38 | 0.2 | $O_2$12$N_2$88 | 200 |
| 12 | $Si_3N_4$ | 1.0 | 2 | 36 | 0.2 | $N_2$100 | 400 |

Heat treatment: 500° C., 2 hours

EXAMPLE 12

An insulating film of silicon nitride was coated on a glass plate in the same manner as in Example 4, except that the reactant gas and the coating rate for each layer used in Example 1 were changed. This sample was heated at 500° C. for 2 hours. The amount of sodium ions present in a near-surface part of this insulating film was 400 counts/sec, showing that the film had the excellent ability to prevent alkali dissolution. That value of sodium ion amount was one-tenth the sodium ion amount in the single-layer film coated in Comparative Example 4 shown in Table 2.

COMPARATIVE EXAMPLE 1

An insulating film was coated on a glass plate to obtain a sample in the same manner as in Example 1, except that the number of layers was changed to 1. The sample was heated at 500° C. for 2 hours. The amount of sodium ions present on the surface of the heat-treated film was as large as 12,000 counts/sec as shown in Table 2.

COMPARATIVE EXAMPLE 3

An insulating film was deposited on a glass plate to obtain a sample in the same manner as in Example 3, except that the film was coated so as to have a single-layer structure. This sample was heated at 500° C. for 2 hours. The amount of sodium ions in the heat-treated film was 4,000 counts/sec.

COMPARATIVE EXAMPLE 4

An insulating film was deposited on a glass plate to obtain a sample in the same manner as in Example 12, except that the film was coated so as to have a single-layer structure. This sample was heated at 500° C. for 2 hours. The amount of sodium ions in the heat-treated film was 4,000 counts/sec.

TABLE 2

| Comparative Example | Kind of film | Total thickness ($\mu$m) | Number of layers | Coating rate for each layer (nm · m/min) | Atmosphere of reduced pressure Total Pressure (Pa) | Atmosphere of reduced pressure Gas composition (vol %) | Sodium ion amount on insulating-film surface (count/sec) |
|---|---|---|---|---|---|---|---|
| 1 | $SiO_2$ | 0.2 | 1 | 50 | 0.02 | $O_2$100 | 12000 |
| 2 | $SiO_2$ | 0.5 | 1 | 50 | 0.02 | $O_2$100 | 4500 |
| 3 | $SiO_2$ | 1.0 | 1 | 50 | 0.02 | $O_2$100 | 4000 |
| 4 | $Si_3N_4$ | 1.0 | 1 | 50 | 0.02 | $N_2$100 | 4000 |

Heat treatment: 500° C., 2 hours

COMPARATIVE EXAMPLE 5

The sample obtained in Example 3 which had not undergone the heat treatment was analyzed by SIMS to determine the amount of sodium ions present in a near-surface part of the insulating film. As a result, the sodium ion amount was found to be 50 counts/sec, which was on the signal noise level for the analytical method used. The insulating film was hence judged to contain no sodium ions in the near-surface part thereof as long as the film had not undergone a heat treatment.

COMPARATIVE EXAMPLE 6

The soda-lime silicate glass used, which was a glass plate produced by the float-glass process, was analyzed by SIMS to determine the amount of sodium ions contained in the glass. The found value is given in Table 3 for reference.

As described above in detail in the Examples and the Comparative Examples, the following was found. When an insulating film is coated on a glass by sputtering for the purpose of inhibiting sodium ions contained in the glass from dissolving away, the thermal diffusion of the sodium ions to the surface of the insulating film can be highly effectively inhibited by coating the film so as to have a multilayer structure.

That an insulating film which has been coated according to the present invention has a multilayer structure can be ascertained by, for example, etching a section of the insulating film with a dilute aqueous solution of hydrofluoric acid and examining the etched surface with an electron microscope.

prevent the alkali ions contained in the glass from dissolving in the insulating film and reaching the film surface through thermal diffusion.

According to the present invention, an insulating film is coated on a glass plate by sputtering so as to have a multilayer structure. Due to the multilayer structure, sodium ions which have diffused into the insulating film from the glass as a result of high-temperature heat treatment are trapped by the interface between layers, whereby the amount of sodium ions which diffuse into the next layer is considerably reduced. Consequently, the amount of sodium ions thermally diffusing to the surface of the insulating film is far smaller than in insulating films continuously coated so as to have a single-layer structure.

In addition, the formation of a multilayered film can be conducted at a high rate and stably for a prolonged time period when the film is coated by reactive sputtering in which two silicon targets respectively disposed on two closely arranged cathodes are used, and a plasma discharge for which one of the cathodes is used as a negative electrode and the other is used as a positive electrode is generated alternately with a plasma discharge for which said one cathode is used as a positive electrode and the other is used as a negative electrode.

The glass substrate for image display of the present invention has a multilayered insulating film, in which the interface between layers functions to trap an alkali component thermally diffusing from the glass plate. Due to this constitution, the alkali component contained in the glass is inhibited from dissolving in the insulating film and reaching the film surface even upon high-temperature heat treatment.

TABLE 3

| Comparative Example | Kind of film | Total thickness (µm) | Number of layers | Coating rate for each layer (nm · m/min) | Atmosphere of reduced pressure | | Sodium ion amount on insulating-film surface (count/sec) |
|---|---|---|---|---|---|---|---|
| | | | | | Total Pressure (Pa) | Gas composition (vol %) | |
| 5 | SiO$_2$ | 1.0 | 1 | 50 | 0.02 | O$_2$100 | 50 |
| 6 | none | | | | | | 3500000 |

Heat treatment: not conducted

The samples obtained in Examples 1 to 12 which had not undergone the heat treatment were evaluated for denseness of the insulating film. These samples were dry-etched with oxygen ions under the same conditions as in the SIMS described above. The etching rates for these samples calculated from the results of the dry etching were from 20 to 25 nm/min, indicating that each film was dense. Furthermore, these samples were wet-etched with an etching solution consisting of 50% hydrofluoric acid, 61% nitric acid, and water in a ratio of 3:2:60 by volume, and the etching rates were calculated from the results of the wet etching. As a result, the etching rates of the SiO$_2$ films were from 132 to 255 nm/min, that of the silicon nitride film was from 0 to 2 nm/min, and those of the silicon oxynitride films varied in the range of from 5 to 120 nm/min depending on oxygen/nitrogen ratio. It was thus found that these insulating films were not especially inferior in denseness to insulating films produced by prior art techniques.

The substrate used in the method for coating an insulating film according to the present invention is not particularly limited in glass composition. When the method is applied to a glass containing a large amount of alkali components such as Na$_2$O and K$_2$O, the coated insulating film can effectively Therefore, the image display using the glass substrate for image display of the present invention is highly reliable.

While the invention has been described in detail and with reference to specific embodiments thereof, it will be apparent to one skilled in the art that various changes and modifications can be made therein without departing from the spirit and scope thereof.

What is claimed is:

1. A method for coating a multilayer insulating film on a glass plate containing an alkali component, the method comprising coating an insulating film selected from the group consisting of SiO$_2$, a silicon oxynitride, and a silicon nitride on the glass plate by reactive sputtering using one or more silicon targets in oxygen or/and nitrogen in a vacuum apparatus in which an atmosphere having a reduced pressure can be adjusted, such that the multilayer insulating film is formed, wherein one or more interfaces between layers of the insulating film function to trap the alkali component thermally diffusing from the e glass plate so that the concentration of alkali ions on the surface of the insulating film is about 0.2% or less of alkali ions in the glass plate.

2. The method for insulating-film deposition of claim 1, wherein the sputtering is reactive sputtering in which two silicon targets respectively disposed on two closely arranged cathodes are used, and a plasma discharge for which one of the cathodes is used as a negative electrode and the other is used as a positive electrode is generated alternately with a plasma discharge for which said one cathode is used as a positive electrode and said other is used as a negative electrode.

3. A glass substrate for image display, which comprises a glass plate containing an alkali component, and a multilayer insulation film coated on a surface of the glass plate, wherein the insulating film is selected from group consisting of a $SiO_2$, a silicon oxynitride, and a silicon nitride and the insulating film is coated by reactive sputtering using one or more silicon targets in oxygen and/or nitrogen in a vacuum apparatus in which and atmosphere having a reduced pressure can be adjusted, such that a multilayer insulating film is formed, and further wherein one or more interfaces between layers of the insulating film function to trap the alkali component thermally diffusing from the glass plate so that the concentration of alkali ions on the surface of the insulating film is about 0.2% or less of the concentration of alkali in the glass plate.

4. The glass substrate for image display as claimed in claim 3, wherein the concentration of alkali ions on the surface of the insulating film is from about 0.002% to about 0.2% of the concentration of alkali ions in the glass plate.

5. The glass substrate for image display as claimed in claim 3, wherein the insulating film has a thickness of 0.5 μm or larger.

6. The glass substrate for image display as claimed in claim 3, wherein the insulating film has a thickness of 2 μm or smaller.

* * * * *